United States Patent
Park

(10) Patent No.: US 11,695,183 B2
(45) Date of Patent: Jul. 4, 2023

(54) BATTERY PACK

(71) Applicant: Samsung SDI Co., Ltd., Yongin-si (KR)

(72) Inventor: Sanghun Park, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 51 days.

(21) Appl. No.: 17/133,982

(22) Filed: Dec. 24, 2020

(65) Prior Publication Data

US 2021/0203031 A1 Jul. 1, 2021

(30) Foreign Application Priority Data

Dec. 31, 2019 (KR) .................. 10-2019-0179792

(51) Int. Cl.
*H01M 50/216* (2021.01)
*H01M 50/109* (2021.01)
*H01M 50/543* (2021.01)
*H05K 3/32* (2006.01)

(52) U.S. Cl.
CPC ....... *H01M 50/216* (2021.01); *H01M 50/109* (2021.01); *H01M 50/543* (2021.01); *H05K 3/323* (2013.01); *H05K 3/326* (2013.01)

(58) Field of Classification Search
CPC ............ H01M 50/216; H01M 50/109; H01M 50/543; H05K 3/323; H05K 3/326
See application file for complete search history.

(56) References Cited

U.S. PATENT DOCUMENTS

| | | |
|---|---|---|
| 5,993,248 A | 11/1999 | Bethurum |
| 7,998,612 B2 | 8/2011 | Sumihara et al. |
| 8,594,597 B2 | 11/2013 | Saito et al. |

(Continued)

FOREIGN PATENT DOCUMENTS

| | | |
|---|---|---|
| CN | 1507670 A | 6/2004 |
| CN | 201160189 Y | 12/2008 |

(Continued)

OTHER PUBLICATIONS

Extended European Search Report for European Patent Application No. 20217622.8, European Search Report dated Apr. 21, 2021 (11 pgs.).

(Continued)

*Primary Examiner* — Jane J Rhee
(74) *Attorney, Agent, or Firm* — Lewis Roca Rothgerber Christie LLP

(57) ABSTRACT

A battery pack includes: a battery cell including first and second surfaces arranged at opposite sides and at which first and second electrodes are respectively located, and a side surface connecting the first and second surfaces to each other; a first circuit board arranged on the first surface and connected to the first electrode; a second circuit board arranged on the second surface; a first flexible line extending from a first side of the first circuit board to the second circuit board while surrounding a portion of the side surface of the battery cell; and a second flexible line extending from a second side of the first circuit board to the second surface of the battery cell while surrounding another portion of the side surface of the battery cell and connected to the second electrode.

20 Claims, 5 Drawing Sheets

(56) References Cited

U.S. PATENT DOCUMENTS

| | | | |
|---|---|---|---|
| 9,728,987 | B2 | 8/2017 | Haering et al. |
| 2004/0115519 | A1 | 6/2004 | Lee |
| 2008/0286634 | A1 | 11/2008 | Naito |
| 2010/0016667 | A1* | 1/2010 | Segawa .............. A61B 1/00105 600/118 |
| 2010/0136374 | A1 | 6/2010 | Jang et al. |
| 2012/0148877 | A1 | 6/2012 | Kalman |

FOREIGN PATENT DOCUMENTS

| | | |
|---|---|---|
| CN | 101646380 A | 2/2010 |
| CN | 101897059 A | 11/2010 |
| CN | 201717167 U | 1/2011 |
| CN | 206921873 U | 1/2018 |
| JP | 6111286 B2 | 3/2017 |
| KR | 10-0284962 B1 | 5/2001 |
| KR | 10-2003-0087981 A1 | 11/2003 |
| KR | 10-1268735 B1 | 5/2013 |
| KR | 10-2015-0009942 A | 1/2015 |
| KR | 10-2017-0071137 A1 | 6/2017 |

OTHER PUBLICATIONS

Chinese Office action dated Sep. 23, 2022 issued in corresponding CN Application No. 202011605777.2, 9 pages.
Korean Office action dated Sep. 21, 2022 issued in corresponding KR Application No. 10-2019-0179792, 5 pages.
Chinese Office Action dated May 11, 2023 issued in corresponding Chinese Patent Application No. 202011605777.2 (7 pages, including 4 pages of English translation).

\* cited by examiner

BATTERY PACK

CROSS-REFERENCE TO RELATED APPLICATION

This application claims priority to and the benefit of Korean Patent Application No. 10-2019-0179792, filed on Dec. 31, 2019 in the Korean Intellectual Property Office, the entire disclosure of which is incorporated herein by reference.

BACKGROUND

1. Field

Aspects of one or more embodiments relate to a battery pack.

2. Description of the Related Art

In general, secondary batteries are rechargeable, unlike primary batteries. Secondary batteries may be used as energy sources for mobile devices, electric vehicles, hybrid vehicles, electric bicycles, uninterruptible power supplies, or the like, and depending on the types of external devices to which they are applied, the secondary batteries may be used in the form of a single battery or in the form of a battery module in which a plurality of batteries are connected and combined into one unit.

A small mobile device, such as a mobile phone, may operate for a certain time according to the output and capacity of a single battery; however, in the case of long-time driving or high-power driving, such as in the case of an electric vehicle or a hybrid vehicle with high power consumption, a battery module including a plurality of batteries may be used due to output and capacity issues, and the battery module may increase the output voltage or the output current according to the number of built-in batteries.

SUMMARY

According to an aspect of one or more embodiments, a battery pack having a relatively low height and having slimness is provided. According to another aspect of one or more embodiments, a battery pack having a relatively low height and slimness may be provided by applying a battery cell having a height smaller than a diameter of an electrode surface and forming an electrical connection between the battery cell and a circuit board through a compressible conductor having a great height reduction effect due to pressurized compression.

Additional aspects will be set forth, in part, in the description which follows and, in part, will be apparent from the description, or may be learned by practice of the presented embodiments.

According to one or more embodiments, a battery pack includes: a battery cell including first and second surfaces arranged at opposite sides and at which first and second electrodes are respectively located, and a side surface connecting the first and second surfaces to each other; a first circuit board arranged on the first surface and connected to the first electrode; a second circuit board arranged on the second surface; a first flexible line extending from a first side of the first circuit board to the second circuit board while surrounding a portion of the side surface of the battery cell; and a second flexible line extending from a second side of the first circuit board to the second surface of the battery cell while surrounding another portion of the side surface of the battery cell and connected to the second electrode.

In one or more embodiments, the first and second sides of the first circuit board may be located at opposite sides along an edge of the first circuit board.

In one or more embodiments, the battery pack may further include a first compressible conductor located between the first electrode and the first circuit board to mediate an electrical connection therebetween.

In one or more embodiments, the first compressible conductor may include a contact elastic body or an anisotropic conductive adhesive.

In one or more embodiments, the battery pack may further include an insulating support located between the battery cell and the first circuit board, and the insulating support may guide a position of the battery cell and the first circuit board assembled at opposite positions through a side wall and a protrusion portion formed at opposite positions from a bottom plate with an opening formed to expose at least a portion of the first circuit board.

In one or more embodiments, the battery pack may further include a first compressible conductor arranged in the opening to mediate an electrical connection between the first electrode of the battery cell and the first circuit board.

In one or more embodiments, the insulating support and the first circuit board may be aligned with each other as a plurality of alignment pins formed along an edge of the insulating support and a plurality of alignment recesses formed along an edge of the first circuit board are respectively fitted to each other, and the insulating support and the first circuit board may be coupled to each other as a plurality of coupling portions formed along an edge of the insulating support and a plurality of coupling recesses formed along an edge of the first circuit board are respectively fitted to each other.

In one or more embodiments, the second flexible line may include a first end portion connected to the first circuit board, and a second end portion connected to the second electrode and defining an extended end portion extended away from the first end portion.

In one or more embodiments, the battery pack may further include a second compressible conductor located between the second end portion of the second flexible line and the second electrode to mediate an electrical connection therebetween.

In one or more embodiments, the second compressible conductor may include an anisotropic conductive adhesive.

In one or more embodiments, the second end portion of the second flexible line and the second circuit board may be arranged at different positions on the second surface of the battery cell so as not to overlap each other.

In one or more embodiments, the second circuit board may include a first side to which the first flexible line is connected and a second side that is opposite to the first side along an edge of the second circuit board, and a cut portion to avoid an interference with the second end portion of the second flexible line may be formed at the second side of the second circuit board.

In one or more embodiments, the second circuit board may have a circular plate shape in which a second-side portion is cut flat.

In one or more embodiments, the first and second circuit boards may define a lowermost portion and an uppermost portion of the battery pack, respectively, and may be structurally bound through the first and second flexible lines extending across the side surfaces of the battery cells on the first and second sides of the first and second circuit boards.

In one or more embodiments, the first and second circuit boards may be arranged in a horizontal posture parallel to the first and second surfaces on the first and second surfaces of the battery cell.

In one or more embodiments, the first and second surfaces of the battery cell may have a circular shape, and the side surface of the battery cell may have a rounded circumferential surface to connect the circular first and second surfaces to each other.

In one or more embodiments, the battery may further include an insulating support located between the battery cell and the first circuit board, and the insulating support, the first circuit board, and the second circuit board may include a rounded circumferential surface to correspond to the battery cell.

In one or more embodiments, the battery cell may have a cylindrical shape having a height smaller than a diameter of the first and second surfaces.

In one or more embodiments, an aspect ratio between the height of the battery cell and the diameter of the first surface may be in a range from about 5.4:12 to about 5.4:14.

In one or more embodiments, the first and second circuit boards may include a battery management system (BMS) to control a charge/discharge operation of the battery cell.

BRIEF DESCRIPTION OF THE DRAWINGS

The above and other aspects, features, and advantages of embodiments will be more apparent from the following description of some example embodiments taken in conjunction with the accompanying drawings, in which.

DETAILED DESCRIPTION

Figure 1:
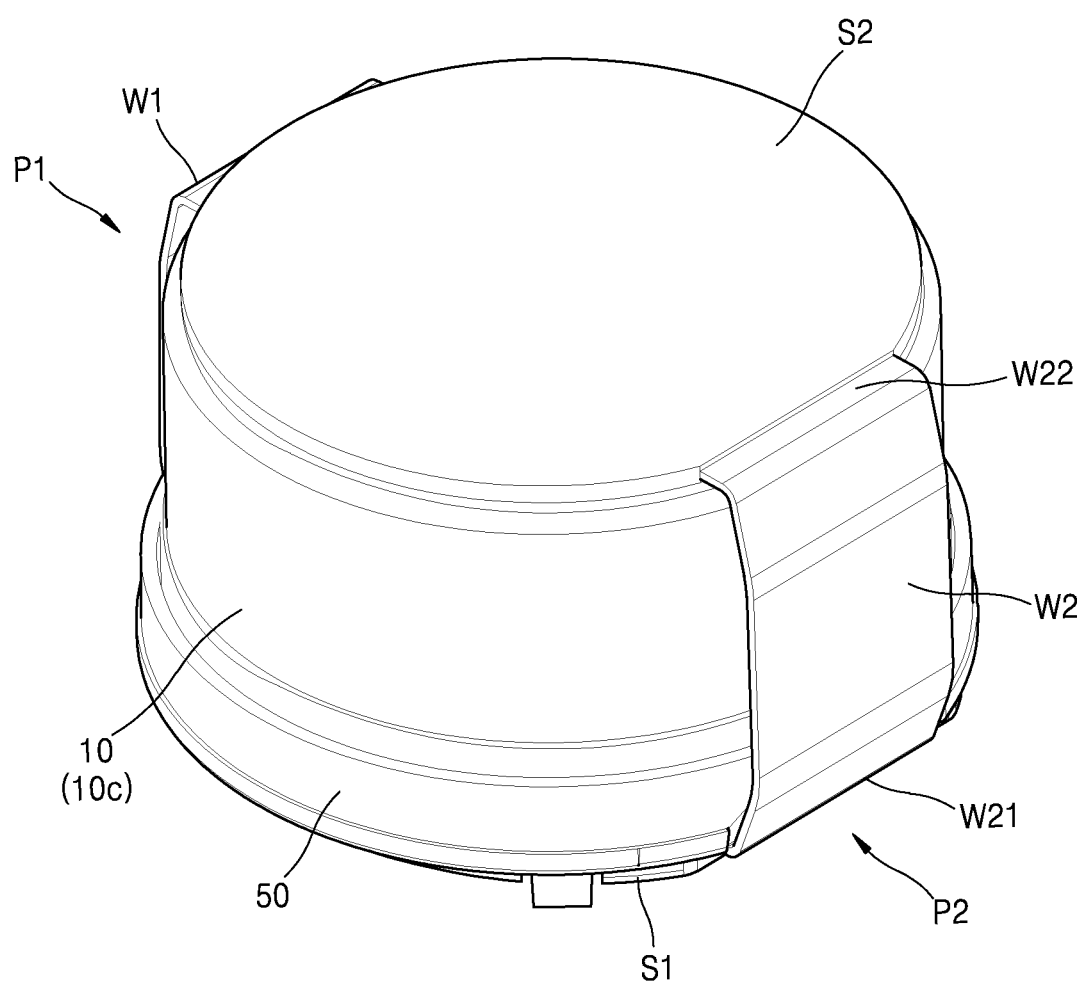
FIG. 1 is a perspective view of a battery pack according to an embodiment.

Reference will now be made in further detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

As used herein, the singular forms "a," "an," and "the" are intended to include the plural forms as well, unless the context clearly indicates otherwise.

It is to be understood that the terms "comprise," "include," and "have" used herein specify the presence of stated features or components, but do not preclude the presence or addition of one or more other features or components.

Sizes of components in the drawings may be exaggerated for convenience of description. In other words, since the sizes and thicknesses of components in the drawings may be arbitrarily illustrated for convenience of description, the following embodiments are not limited thereto.

It is to be understood that when a layer, region, or component is referred to as being "connected to" another layer, region, or component, it may be directly connected to the other layer, region, or component or may be indirectly connected to the other layer, region, or component with one or more intervening layers, regions, or components interposed therebetween. For example, it is to be understood that when a layer, region, or component is referred to as being "electrically connected to" another layer, region, or component, it may be directly electrically connected to the other layer, region, or component or may be indirectly electrically connected to the other layer, region, or component with one or more intervening layers, regions, or components interposed therebetween.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

A battery pack according to some example embodiments is described below with reference to the accompanying drawings.

Figure 2:
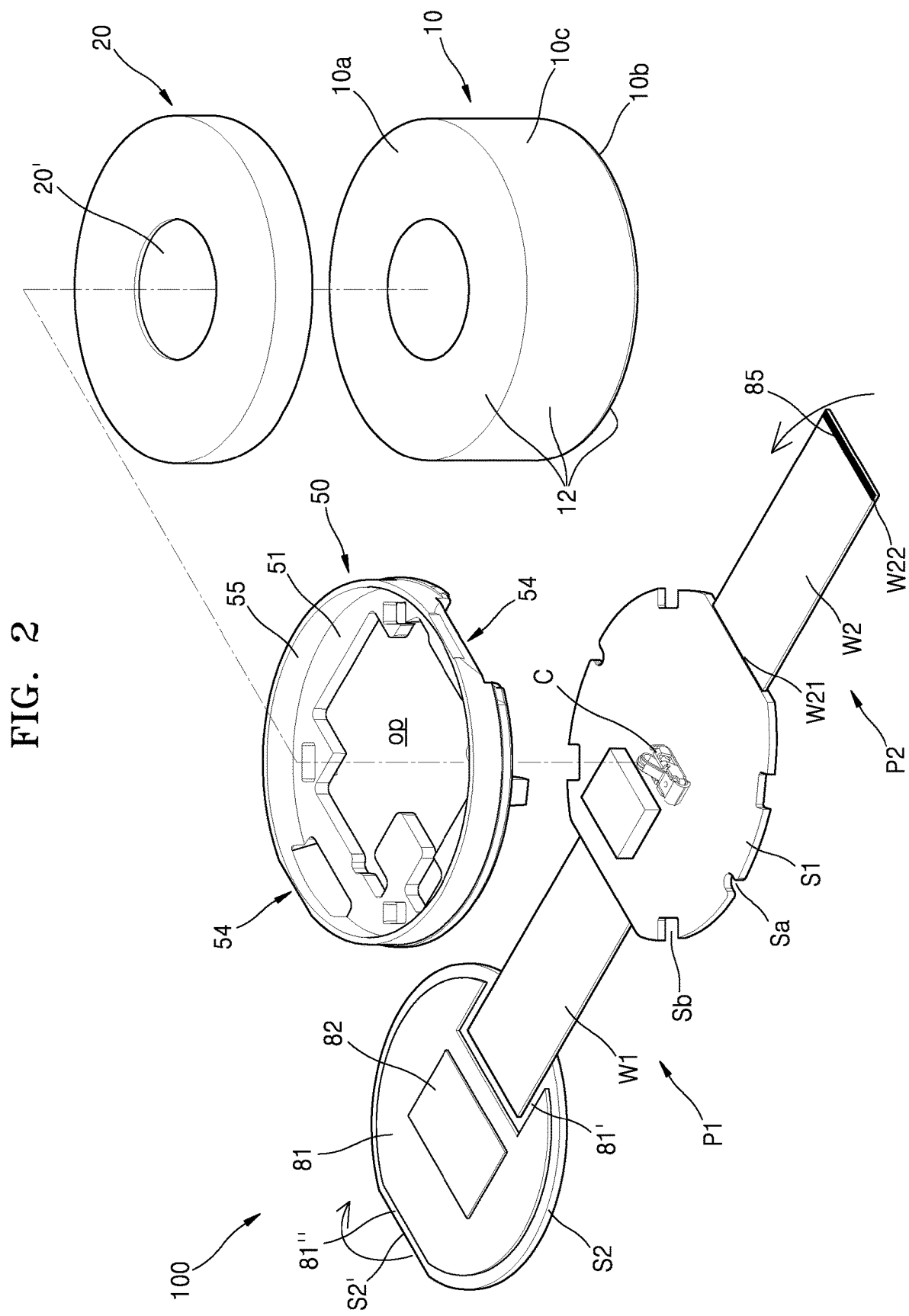
FIGS. 2 and 3 are exploded perspective views of the battery pack illustrated in FIG. 1, which illustrate the assembly of the battery pack of FIG. 1 according to various processes.
Figure 3:
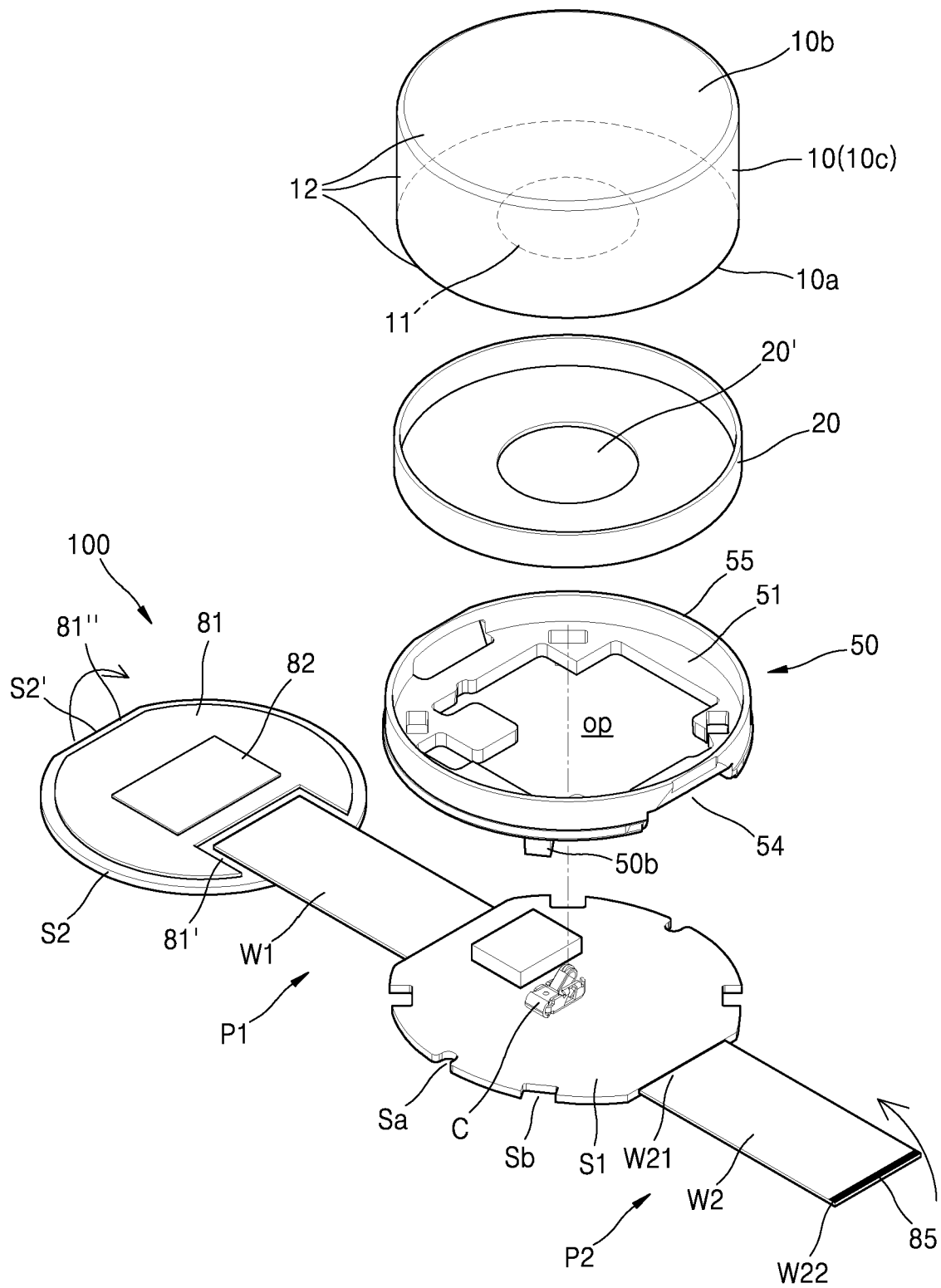
Figure 4:
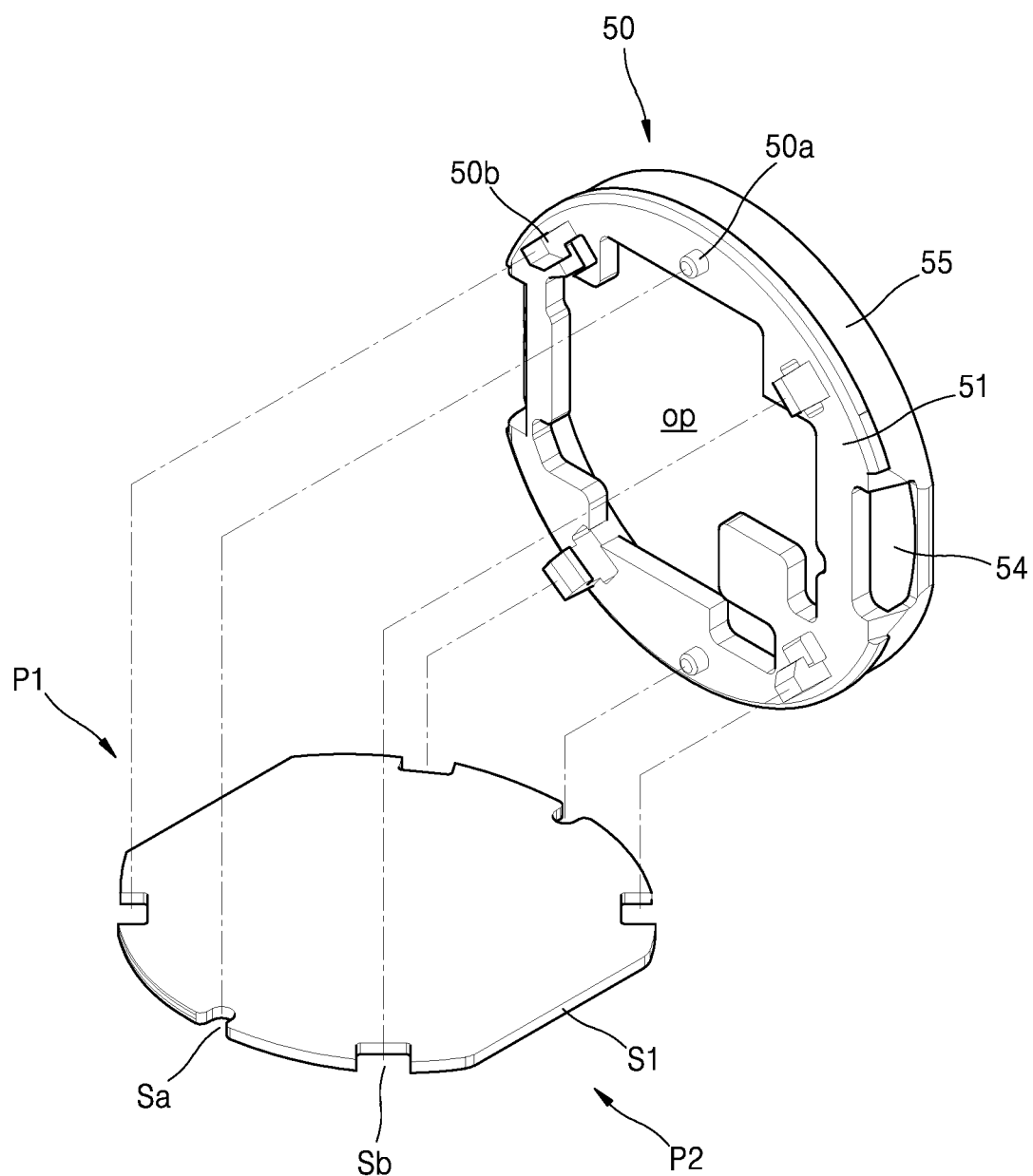
FIG. 4 is a perspective view illustrating an assembly structure between an insulating support and a first circuit board illustrated in FIG. 2.
Figure 5:
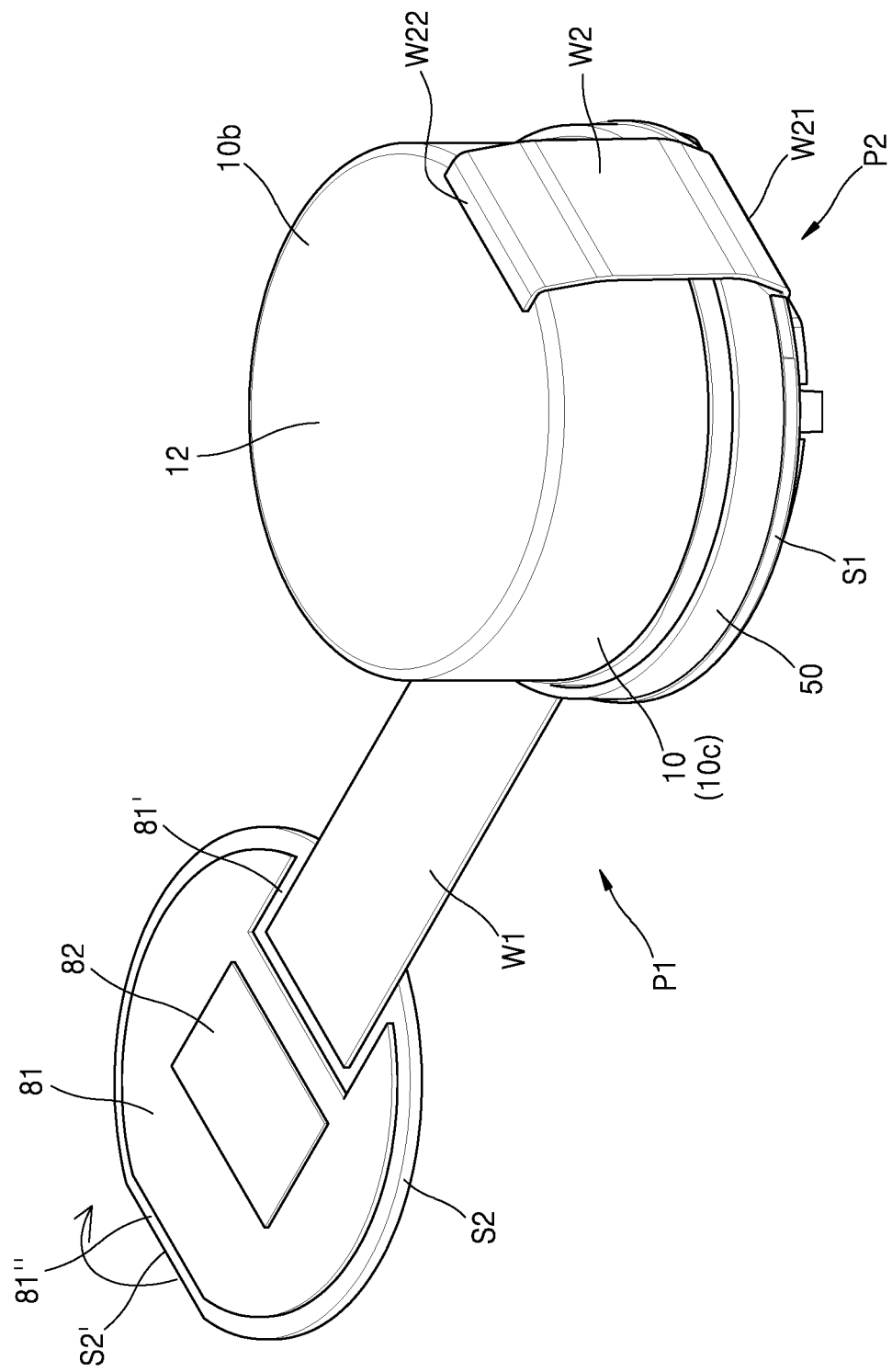
FIG. 5 is a partially exploded perspective view illustrating the assembly of the battery pack of FIG. 1 according to various processes following FIGS. 2 and 3.

FIG. 1 is a perspective view of a battery pack according to an embodiment; FIGS. 2 and 3 are exploded perspective views of the battery pack illustrated in FIG. 1, which illustrate the assembly of the battery pack of FIG. 1 according to various processes (e.g., sequential processes); FIG. 4 is a perspective view illustrating an assembly structure between an insulating support and a first circuit board illustrated in FIG. 2; and FIG. 5 is an exploded perspective view illustrating the assembly of the battery pack of FIG. 1 according to various processes together with FIGS. 2 and 3.

Referring to FIGS. 2 and 3, a battery pack according to an embodiment of the present disclosure may include a battery cell 10 including first and second surfaces 10*a* and 10*b* at which first and second electrodes 11 and 12 are respectively formed and which are formed at opposite sides, and a side surface 10*c* connecting the first and second surfaces 10*a* and 10*b* to each other, a first circuit board S1 arranged on the first surface 10*a* and connected to the first electrode 11, a second circuit board S2 arranged on the second surface 10*b*, a first flexible line W1 connecting the first and second circuit boards S1 and S2 to each other and extending from a first side P1 of the first circuit board S1 to surround (e.g., partially surround) the side surface 10c of the battery cell 10, and a second flexible line W2 extending from a second side P2 of the first circuit board S1, extending to surround (e.g., partially surround) the side surface 10c of the battery cell 10, and connected to the second electrode 12.

The battery cell 10 may include the first and second surfaces 10a and 10b opposite to each other and the side surface 10c connecting the first and second surfaces 10a and 10b to each other. For example, the battery cell 10 according to an embodiment may include circular first and second surfaces 10a and 10b and a side surface 10c rounded in the form of a circumferential surface to connect the circular first and second surfaces 10a and 10b to each other.

As described below, an insulating support 50 of the battery pack of the present disclosure and the first and second circuit boards S1 and S2 may include a circumferential surface rounded to correspond to the battery cell 10. In this case, that the insulating support 50 and the first and second circuit boards S1 and S2 include a rounded circumferential surface may mean that a circumferential surface is formed over at least a portion along the edge of the first and second circuit boards S1 and S2 and the insulating support 50 and may not necessarily mean that the entire edge of the first and second circuit boards S1 and S2 and the insulating support 50 are formed as a circumferential surface.

As described below, the insulating support 50 and the first and second circuit boards S1 and S2 may include a circumferential surface rounded to correspond to the battery cell 10, may be formed in a shape corresponding to the battery cell 10 along the circumferential direction of the battery cell 10 not to form an additional volume from the battery cell 10 in general, and may not be formed in a shape in which one side thereof protrudes in a particular direction along the outer periphery of the battery cell 10 considering a limited mounting space of a small device in which the battery pack is mounted.

For example, the battery cell 10 according to an embodiment may be formed in a slim cylindrical shape formed with a height smaller than the diameter of the circular first surface 10a. For example, with respect to an aspect ratio of the battery cell 10, an aspect ratio of the diameter of the first surface 10a to the height thereof may be formed in a ratio of about 5.4:12 to about 5.4:14.

First and second electrodes 11 and 12 of opposite polarities may be formed on the first and second surfaces 10a and 10b of the battery cell 10. In an embodiment, for example, the first electrode 11 may be formed at a central position of the first surface 10a, and the second electrode 12 may be formed from the second surface 10b (e.g., the entire second surface 10b) over the side surface 10c and may extend from the side surface 10c to a peripheral position of the first surface 10a surrounding the central position of the first surface 10a. In an embodiment, the first and second electrodes 11 and 12 may be formed together at different positions on the first surface 10a, wherein the first and second electrodes 11 and 12 may be respectively formed at a central position of the first surface 10a and a peripheral position surrounding the central position and may be formed to be spaced apart from each other and electrically insulated from each other. Throughout the present disclosure, that the first and second electrodes 11 and 12 are formed on the first and second surfaces 10a and 10b of the battery cell 10 may mean that the first and second electrodes 11 and 12 are formed at the center position of the first and second surfaces 10a and 10b. As described below, the first and second electrodes 11 and 12 of the battery cell 10 may be respectively electrically connected to the first circuit board S1 and the second flexible line W2 arranged on the first and second surfaces 10a and 10b of the battery cell 10.

The first electrode 11 of the battery cell 10 may be connected to the first circuit board S1. The battery cell 10 may be arranged on the first circuit board S1 such that the first surface 10a where the first electrode 11 is formed may face the first circuit board S1. For example, the battery cell 10 illustrated in FIG. 2 may be arranged on the first circuit board S1 to be vertically inverted such that the upper first surface 10a and the lower second surface 10b may be vertically inverted and, thus, the first electrode 11 formed on the first surface 10a of the battery cell 10 may be electrically connected to the first circuit board S1. In other words, the first circuit board S1 may be arranged on the first surface 10a of the battery cell 10.

In an embodiment, a first compressible conductor C may be located between the first electrode 11 and the first circuit board S1 to mediate a conductive connection therebetween. The first compressible conductor C may be compressed between the first electrode 11 and the first circuit board S1 as the first electrode 11 and the first circuit board S1 are pressed in opposite directions, and may form a solid electrical connection therebetween by being adhered or pressed therebetween under the influence of a restoration force due to the compression. In an embodiment, the first compressible conductor C may include a contact elastic body, such as a contact spring, or an anisotropic conductive adhesive, such as an anisotropic conductive film (ACF). For reference, in the accompanying drawings of the disclosure, a contact elastic body is illustrated as the first compressible conductor C.

The insulating support 50 may be arranged between the battery cell 10 and the first circuit board S1. The insulating support 50 may include a bottom plate 51 with an opening op formed at a central position thereof and a side wall 55 protruding from the edge of the bottom plate 51 toward the battery cell 10. The insulating support 50 may maintain the assembly position of the battery cell 10 at a normal position through the side wall 55 surrounding the side surface 10c of the battery cell 10 and may support the battery cell 10 through the bottom plate 51 supporting the bottom of the battery cell 10. In this case, the opening op for exposing at least a portion of the first circuit board S1 may be formed at the bottom plate 51, and an electrical connection between the battery cell 10 and the first circuit board S1 may be provided through the opening op. That is, the first compressible conductor C for mediating an electrical connection between the first electrode 11 of the battery cell 10 and the first circuit board S1 may be arranged in the opening op.

Referring to FIG. 4, the insulating support 50 may include an alignment pin 50a and a coupling portion 50b protruding from the bottom plate 51 toward the first circuit board S1, may maintain the assembly position of the first circuit board S1 at a normal position through the alignment pin 50a, and may fix the first circuit board S1 through the coupling portion 50b. That is, the insulating support 50 may support the battery cell 10 and the first circuit board S1 assembled at opposite positions, through the side wall 55 and the alignment pin 50a formed at opposite positions from the bottom plate 51 with the opening op formed therein, and may align the relative position between the battery cell 10 and the first circuit board S1. In an embodiment, for example, the alignment pin 50a may include a pair of alignment pins 50a arranged to face each other on the bottom plate 51 of the insulating support 50 with the opening op therebetween. In an embodiment, an alignment recess Sa into which the alignment pin 50a of the insulating support 50 may be fitted may be formed at the first circuit board S1, and, in an embodiment, the positions of the insulating support 50 and the first circuit board S1 may be aligned through a fitted coupling between a pair of alignment recesses Sa formed at opposite sides of the first circuit board S1 and a pair of alignment pins 50a formed at positions corresponding to the alignment recesses Sa.

In an embodiment, the coupling portion 50b may include two pairs of coupling pieces 50b formed at positions facing each other on the bottom plate 51 of the insulating support 50 with the opening op therebetween. In this case, the coupling portions 50b forming each pair may face each other along a direction intersecting with each other, and a balanced coupling with the circuit board S1 may be formed through a total of four coupling portions 50b formed at mutually symmetrical positions along the edge of the bottom plate 51. In an embodiment, the first circuit board S1 may include coupling recesses Sb formed at four symmetrical points corresponding to the coupling portion 50b along the edge of the first circuit board S1, and a coupling between the first circuit board S1 and the insulating support 50 may be formed while the coupling portion 50b of the insulating support 50 is fitted into the coupling recess Sb of the first circuit board S1. In an embodiment, the coupling recess Sb and the coupling portion 50b may form a hook coupling, and the coupling portion 50b may include a hook at a front end thereof and may fix the position of the first circuit board S1 while the hook of the coupling portion 50b is adhered or fastened to the first circuit board S1 around the coupling recess Sb through an elastic deformation of the coupling portion 50b.

In an embodiment, an opening portion 54 for fixing the position of the first and second flexible lines W1 and W2 by accommodating a portion of each of the first and second flexible lines W1 and W2 is formed at each of the first and second sides P1 and P2 opposite to each other along the edge of the insulating support 50. In an embodiment, the opening portion 54 of the insulating support 50 may be formed as a pair at the first and second sides P1 and P2 facing away from each other and may be formed in a shape in which a corner portion formed by the bottom plate 51 and the side wall 55 of the insulating support 50 is cut. As described below, the first and second flexible lines W1 and W2 may extend from the opposite first and second sides P1 and P2 of the first circuit board S1, and the first and second flexible lines W1 and W2 extending from the first and second sides P1 and P2 of the first circuit board S1 may be fixed by being partially accommodated in the opening portion 54 to surround the opening portion 54 of the insulating support 50 arranged on the first circuit board S1. For reference, in the present disclosure, the first and second sides P1 and P2 may refer to opposite sides along the circumferential direction of the battery cell 10 in the battery pack formed in a substantially circular shape corresponding to the circular battery cell 10, and the first and second sides P1 and P2 of the insulating support 50, the first and second sides P1 and P2 of the first circuit board S1, or the first and second sides P1 and P2 of the second circuit board S2 may refer to the same positions along the circumferential direction of the battery cell 10. For reference, in FIGS. 2, 3, and 5, the first and second sides P1 and P2 of the second circuit board S2 or an insulating sheet 81 arranged on the second circuit board S2 may correspond to opposite directions to the first and second sides P1 and P2 of the battery cell 10 because they are based not on a state in which the second circuit board S2 is unfolded as in the drawings but on a state in which the battery pack is completely assembled as the second circuit board S2 is seated on the second surface 10b of the battery cell 10 while being vertically or horizontally inverted as illustrated in FIG. 1.

Referring to FIGS. 2, 3, and 5, in an embodiment, the insulating support 50 and the first circuit board S1 may be sequentially arranged on the first surface 10a of the battery cell 10, and the insulating support 50 and the first circuit board S1 may be formed in a circular shape corresponding to the battery cell 10. That is, in an embodiment, the insulating support 50 and the first circuit board S1 are formed in a shape corresponding to the battery cell 10 along the circumferential direction of the battery cell 10 so as not to form an additional volume from the battery cell 10. In an embodiment, for example, the insulating support 50 and the first circuit board S1 may not be formed in a shape in which one side thereof protrudes in a particular direction along the outer periphery of the battery cell 10 considering the limited mounting space of a small device in which the battery pack is mounted.

The first circuit board S1 may be arranged on the first surface 10a of the battery cell 10, and the second circuit board S2 electrically connected to the first circuit board S1 may be arranged on the second surface 10b of the battery cell 10. The first and second circuit boards S1 and S2 may cooperate with each other to control a charge/discharge operation of the battery cell 10, and, in an embodiment, a battery management system (BMS) for controlling a charge/discharge operation of the battery cell 10 may be distributedly arranged on the first and second circuit boards S1 and S2. For example, the battery management system distributedly arranged on the first and second circuit boards S1 and S2 may monitor a state of the battery cell 10, control a charge/discharge operation of the battery cell 10 according to the monitoring state, and detect an abnormal situation, such as overheating, overvoltage, or overcurrent of the battery cell 10 to perform a protection operation, such as stopping the charge/discharge operation.

In an embodiment, the first circuit board S1 may function as a main circuit board where an output terminal (not illustrated) of the battery pack is formed, and the second circuit board S2 may function as a sub circuit board for obtaining state information of the battery cell 10, such as the temperature of the battery cell 10 and transmitting the obtained state information of the battery cell 10 to the first circuit board S1 or transmitting a user's operation signal such as an on/off operation signal to the first circuit board S1. In an embodiment, for example, a thermistor (not illustrated) for measuring the temperature of the battery cell 10 may be arranged on the second circuit board S2.

In an embodiment, the first circuit board S1 as the main circuit board may be formed as a double-sided circuit board in which circuit elements are arranged on both upper and lower sides or line patterns are formed on both the upper and lower sides thereof. In an embodiment, the second circuit board S2 as the sub circuit board may be formed as a single-sided circuit board in which circuit elements and/or line patterns are selectively formed on any one of upper and lower sides thereof. However, in another embodiment, the first circuit board S1 may be formed as a single-sided circuit board in which circuit elements and/or line patterns are selectively formed on any one of the upper and lower sides, and the second circuit board S2 be formed as a double-sided circuit board in which circuit elements and/or line patterns are formed on both the upper and lower sides.

An electrical connection between the first and second circuit boards S1 and S2 may be formed through the first flexible line W1. The first flexible line W1 may be connected to the first side P1 of the first circuit board S1 along the edge of the first circuit board S1. As described below, the second flexible line W2 may be connected to the second side P2 opposite to the first side P1 of the first circuit board S1 along the edge of the first circuit board S1.

In order to connect the first and second circuit boards S1 and S2 to each other, the first flexible line W1 may be connected to the first side P1 of the second circuit board S2 while extending from the first side P1 of the first circuit board S1 and extending to surround (e.g., partially surround) the side surface 10c of the battery cell 10. Here, the first side P1 of the first and second circuit boards S1 and S2 may be formed in the same direction along the edge of the first and second circuit boards S1 and S2 and, for example, may refer to the same direction along the circumferential direction of the battery cell 10. The first flexible line W1 may be connected to the first side P1 of the first and second circuit boards S1 and S2 to mediate an electrical connection between the first and second circuit boards S1 and S2. Throughout the present disclosure, that the first flexible line W1 is connected to the first and second circuit boards S1 and S2 may mean that the first flexible line W1 is connected to the first and second circuit boards S1 and S2 through a separate connection structure or may mean that the first flexible line W1 is connected to the first and second circuit boards S1 and S2 in the form of being integrally formed with a portion of the first and second circuit boards S1 and S2. For example, the first flexible line W1 may be connected to the first and second circuit boards S1 and S2 through a separate connection structure, such as a connection pad formed on the first and second circuit boards S1 and S2, or the first flexible line W1 may be connected to the first and second circuit boards S1 and S2 as a flexible circuit arranged to overlap on the first and second circuit boards S1 and S2 as a portion of the first and second circuit boards S1 and S2 is provided to protrude from the first and second circuit boards S1 and S2.

The first electrode 11 of the battery cell 10 may be connected to the first circuit board S1, while the second electrode 12 of the battery cell 10 may be connected to the second flexible line W2. That is, the first and second electrodes 11 and 12 formed on the opposite first and second surfaces 10a and 10b of the battery cell 10 may be respectively electrically connected to the first circuit board S1 and the second flexible line W2 formed on the first and second surfaces 10a and 10b.

In an embodiment, the second flexible line W2 may be connected to the second side P2 along the edge of the first circuit board S1. In this case, the second side P2 of the first circuit board S1 where the second flexible line W2 is connected may be formed on the opposite side of the first side P1 of the first circuit board S1 where the first flexible line W1 is connected. That is, the first and second flexible lines W1 and W2 may be respectively connected to the first and second sides P1 and P2 opposite to each other along the edge of the first circuit board S1.

Throughout the present disclosure, that the second flexible line W2 is connected to the first circuit board S1 may mean that the second flexible line W2 is connected to the first circuit board S1 through a separate connection structure or may mean that the second flexible line W2 is connected to the first circuit board S1 in the form of being integrally formed with a portion of the first circuit board S1. For example, the second flexible line W2 may be connected to the first circuit board S1 through a separate connection structure, such as a connection pad formed on the first circuit board S1, or the second flexible line W2 may be connected to the first circuit board S1 as a flexible circuit arranged to overlap on the first circuit board S1 as a portion of the first circuit board S1 is provided to protrude from the first circuit board S1.

The second flexible line W2 may be connected to the second electrode 12 formed on the second surface 10b of the battery cell 10 while surrounding (e.g., partially surrounding) the side surface 10c of the battery cell 10 from the second side P2 of the first circuit board S1. In an embodiment, the second flexible line W2 may include a first end portion W21 connected to the second side P2 of the first circuit board S1 and a second end portion W22 connected to the second electrode 12. In an embodiment, the second flexible line W2 may be connected to the second electrode 12 of the battery cell 10 through a second compressible conductor 85 formed at the second end portion W22. That is, the second compressible conductor 85 may be located between the second electrode 12 and the second end portion W22 of the second flexible line W2 to mediate a conductive connection therebetween. The second compressible conductor 85 may be compressed between the second electrode 12 and the second end portion W22 of the second flexible line W2 as the second electrode 12 and the second end portion W22 of the second flexible line W2 are pressed in opposite directions, and may form a solid electrical connection therebetween by being adhered or pressed therebetween under the influence of a restoration force due to the compression. In an embodiment, the second compressible conductor 85 may include an anisotropic conductive adhesive, such as an anisotropic conductive film (ACF). In an embodiment, by pressing the second end portion W22 of the second flexible line W2, at which an anisotropic conductive adhesive as the second compressible conductor 85 is formed, toward the second electrode 12, the anisotropic conductive adhesive between the second end portion W22 of the second flexible line W2 and the second electrode 12 may be compressed and conductive particles dispersed between insulating substrates forming the anisotropic conductive adhesive may be connected to each other and, accordingly, the second electrode 12 and the second end portion W22 of the second flexible line W2 may be electrically connected to each other through the anisotropic conductive adhesive. In this case, as the anisotropic conductive adhesive as the second compressible conductor 85 is compressed between the second electrode 12 and the second end portion W22 of the second flexible line W2, a height of the entire battery pack may be reduced and a battery pack that is slim in the height direction may be provided. In an embodiment, by applying an anisotropic conductive adhesive having a great height reduction effect due to pressurized compression as the second compressible conductor 85, a battery pack that is slimmer in the height direction relative to a contact elastic body, such as a contact spring, may be provided. In another embodiment, the second electrode 12 and the second flexible line W2 may be coupled to each other by a thermal bonding method, such as laser welding, and in this sense, the second electrode 12 and the second flexible line W2 may be coupled to each other with the second compressible conductor 85 therebetween or may be coupled to each other through a thermal bonding method, such as laser welding.

The second end portion W22 of the second flexible line W2 may be connected to the second electrode 12 while being pressed on the second surface 10b of the battery cell 10, and the second circuit board S2 may be arranged on the second surface 10b together with the second end portion W22 of the second flexible line W2. That is, the second end portion W22 of the second flexible line W2 and the second circuit board S2 may be arranged at different positions on the second surface 10b by extending from the opposite first and second sides P1 and P2 of the first circuit board S1. In an embodiment, to avoid interference between the second end portion W22 of the second flexible line W2 and the second circuit board S2 arranged together on the second surface 10b of the battery cell 10, a first cut portion S2' may be formed at the second circuit board S2, and, in an embodiment, the first cut portion S2' may be formed at the second side P2 of the second circuit board S2 where the second end portion W22 of the second flexible line W2 is arranged. The second circuit board S2 and the second end portion W22 of the second flexible line W2 may be formed at different positions on the second surface 10b of the battery cell 10 through the first cut portion S2' of the second circuit board S2 without overlapping each other, and, in an embodiment, the second circuit board S2 may overlap on the second end portion W22 of the second flexible line W2 so as not to form an additional height. In an embodiment, the second circuit board S2 in which the first cut portion S2' is formed may be formed in a circular plate shape in which the position of the second side P2 is cut flat.

As such, because the second circuit board S2 and the second end portion W22 of the second flexible line W2 are arranged at different positions on the flat second surface 10b without overlapping each other, the second circuit board S2 may maintain a horizontal posture on the flat second surface 10b and an additional height may not be formed on the flat second surface 10b of the flat battery cell 10 as though the second circuit board S2 were obliquely inclined. As such, in an embodiment, a battery pack that is slim in the height direction may be provided through the first cut portion S2' of the second circuit board S2 formed to avoid the second end portion W22 of the second flexible line W2. In an embodiment, the first and second circuit boards S1 and S2 may be horizontally arranged in parallel to the flat first and second surfaces 10a and 10b, and an additional height may not be formed as though the first and second circuit boards S1 and S2 were obliquely arranged on the flat first and second surfaces 10a and 10b, and a battery pack having increased slimness may be provided.

Although not illustrated in the drawings, in another embodiment, the second circuit board S2 may be arranged to overlap the second end portion W22 of the second flexible line W2. That is, the second side P2 of the second circuit board S2 may overlap the second end portion W22 of the second flexible line W2, and an accommodation groove (not illustrated) capable of accommodating the second end portion W22 of the second flexible line W2 may be formed at the second side P2 of the second circuit board S2. Through an accommodation groove (not illustrated) for accommodating the second end portion W22 of the second flexible line W2 forming a shape partially protruding from the flat second surface 10b, the second circuit board S2 may maintain a horizontal posture on the flat second surface 10b, and an additional height may not be formed along the height direction by the second circuit board S2 obliquely inclined from the flat second surface 10b of the battery cell 10.

In an embodiment, the insulating sheet 81 for electrical insulation between the second circuit board S2 and the second surface 10b of the battery cell 10 may be located therebetween, and the second circuit board S2 may be coupled to the second surface 10b of the battery cell 10 through an adhesive member 82 formed on the insulating sheet 81. In an embodiment, the adhesive member 82 may include a double-sided tape. For example, the insulating sheet 81 and the adhesive member 82 may be sequentially arranged on the second circuit board S2 facing the second surface 10b of the battery cell 10. In an embodiment, an accommodation recess 81' for accommodating an end portion of the first flexible line W1 may be formed at the first side P1 of the insulating sheet 81, and a second cut portion 81" for avoiding interference with the end portion (corresponding to the second end portion W22) of the second flexible line W2 may be formed at the second side P2 of the insulating sheet 81. Through the accommodation recess 81' and the second cut portion 81" of the insulating sheet 81, the insulating sheet 81 and the end portion of the first and second flexible lines W1 and W2 may not overlap each other on the flat second surface 10b, and a battery pack having a structure having increased slimness may be provided by avoiding an additional height from being formed due to the insulating sheet 81 and the end portion of the first and second flexible lines W1 and W2 overlapping each other on the flat second surface 10b.

In an embodiment, the entire battery pack may be structurally bound because the second circuit board S2 and the second end portion W22 of the second flexible line W2 respectively extending from the opposite first and second sides P1 and P2 of the first circuit board S1 arranged on the first surface 10a of the battery cell 10 are coupled on the second surface 10b of the battery cell 10. For example, the second circuit board S2 may be coupled onto the second surface 10b through the adhesive member 82, and the second end portion W22 of the second flexible line W2 may be coupled onto the second surface 10b through the second compressible conductor 85. The first and second circuit boards S1 and S2 may form a lowermost portion and an uppermost portion of the battery pack, and the entire battery pack may be structurally bound through the first and second flexible lines W1 and W2 extending across the side surface 10c of the battery cell 10 on the first and second sides P1 and P2 of the first and second circuit boards S1 and S2.

Referring to FIGS. 2 and 3, in an embodiment, an insulating cap 20 for electrical insulation between the first circuit board S1 and the first surface 10a of the battery cell 10 may be located therebetween, and the insulating cap 20 may block electrical interference between the first circuit board S1 and the second electrode 12 formed around the first electrode 11 while allowing an electrical connection between the first circuit board S1 and the first electrode 11 exposed through an electrode hole 20' of the insulating cap 20. That is, the insulating cap 20 may be formed to cover the first surface 10a of the battery cell 10, may allow an electrical connection between the first electrode 11 and the first circuit board S1 through the electrode hole 20' exposing at least a portion of the first electrode 11 formed at a central position of the first surface 10a, and may block electrical interference between the first circuit board S1 and the second electrode 12 formed at a peripheral position of the first surface 10a. In an embodiment, the insulating cap 20 may extend to the side surface 10c of the battery cell 10 where the second electrode 12 extends together with the first surface 10a of the battery cell 10, thereby providing electrical insulation between the second electrode 12 and the first circuit board S1.

Herein, the assembly of a battery pack according to an embodiment will be described with reference to FIGS. 1 to 5.

First, as illustrated in FIG. 2, a circuit structure 100 in which the first and second circuit boards S1 and S2 and the first and second flexible lines W1 and W2 are connected to each other may be prepared. For example, the circuit structure 100 may be formed in a shape in which the first and second circuit boards S1 and S2 and the first and second flexible lines W1 and W2 are connected to each other. In an embodiment, the circuit structure 100 may be formed in a shape of a single component by being connected through a separate connection portion, such as a connection pad, after the first and second circuit boards S1 and S2 and the first and second flexible lines W1 and W2 are separately formed. In another embodiment, the circuit structure 100 may be formed in a shape in which the first and second circuit boards S1 and S2 and the first and second flexible lines W1 and W2 are integrally formed. For example, a flexible circuit board may extend to the second circuit board S2 through the first flexible line W1 while protruding from the first side P1 of the first circuit board S1 across the first circuit board S1, and the flexible circuit board may extend to the second flexible line W2 while protruding from the second side P2 of the first circuit board S1. In this case, the flexible circuit board may be integrally formed with the first and second circuit boards S1 and S2 as a portion of the first and second circuit boards S1 and S2 and may form the first and second flexible lines W1 and W2. In an embodiment, for example, together with the flexible circuit board, the first and second circuit boards S1 and S2 may be formed of a multilayer circuit in which rigid circuit boards are stacked on each other. In an embodiment, for example, the flexible circuit board may be formed in common with respect to the first and second circuit boards S1 and S2 while extending across the first and second circuit boards S1 and S2 together, and the rigid circuit boards may be separately formed with respect to each of the first and second circuit boards S1 and S2 to form the first and second circuit boards S1 and S2 together with the flexible circuit board.

Next, as illustrated in FIG. 2, the insulating support 50 may be arranged on the circuit structure 100. In an embodiment, while the insulating support 50 is assembled with respect to the first circuit board S1 of the circuit structure 100, the alignment pin 50a and the coupling portion 50b of the insulating support 50 may be respectively fitted into the alignment recess Sa and the coupling recess Sb of the first circuit board S1 and the insulating support 50 may be assembled at a normal position on the circuit structure 100. As such, when the insulating support 50 is assembled at a normal position on the circuit structure 100, the first compressible conductor C arranged on the first circuit board S1 may be exposed through the opening op of the insulating support 50.

Next, as illustrated in FIG. 3, the battery cell 10 may be assembled on the insulating support 50. In this case, while the first surface 10a of the battery cell 10 is located on the first compressible conductor C exposed through the opening op of the insulating support 50, the battery cell 10 may be assembled on the insulating support 50 such that the first electrode 11 formed on the first surface 10a may form a connection with the first circuit board S1 with the first compressible conductor C therebetween. Then, the battery cell 10 may be assembled at a normal position on the insulating support 50 by being guided by the side wall 55 of the insulating support 50.

Next, as illustrated in FIG. 5, the second flexible line W2 extending from the second side P2 of the first circuit board S1 may be seated on the second electrode 12 formed at the second surface 10b of the battery cell 10. That is, the second flexible line W2 may include the first end portion W21 connected to the second side P2 of the first circuit board S1 and the second end portion W22 extending from the first end portion W21 and may seat the second end portion W22 on the second electrode 12 formed at the second surface 10b of the battery cell 10. Here, while the second flexible line W2 surrounds (e.g., partially surrounds) the side surface 10c of the battery cell 10, the second end portion W22 of the second flexible line W2 may be seated on the second electrode 12, and in this case, the second compressible conductor 85, for example, an anisotropic conductive adhesive, may be located between the second end portion W22 of the second flexible line W2 and the second electrode 12. Then, by pressing the second end portion W22 of the second flexible line W2 toward the second electrode 12, the second compressible conductor 85 (e.g., an anisotropic conductive adhesive) located therebetween may become conductive and the second flexible line W2 and the second electrode 12 may be electrically connected to each other.

Next, the second circuit board S2 connected to the first flexible line W1 extending from the first side P1 of the first circuit board S1 may be seated on the second surface 10b of the battery cell 10. Here, while the first flexible line W1 extending from the first side P1 of the first circuit board S1 surrounds (e.g., partially surrounds) the side surface 10c of the battery cell 10, the second circuit board S2 connected to the first flexible line W1 may be seated on the second surface 10b. In this case, the battery pack illustrated in FIG. 1 may be provided by coupling the second circuit board S2 onto the second surface 10b through the adhesive member 82 formed on the second circuit board S2.

According to embodiments of the present disclosure, a battery pack has a relatively low height and slimness by applying a battery cell having a height smaller than the diameter of an electrode surface and forming an electrical connection between the battery cell and a circuit board through a compressible conductor having a great height reduction effect due to pressurized compression.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as set forth by the following claims.

What is claimed is:

1. A battery pack comprising:
   a battery cell comprising first and second surfaces arranged at opposite sides and at which first and second electrodes are respectively located, and a side surface connecting the first and second surfaces to each other;
   a first circuit board arranged on the first surface and connected to the first electrode;
   a second circuit board arranged on the second surface;
   a first flexible line extending from a first side of the first circuit board to the second circuit board while surrounding a portion of the side surface of the battery cell; and
   a second flexible line extending from a second side of the first circuit board to the second electrode at the second surface of the battery cell while surrounding another portion of the side surface of the battery cell and connected to the second electrode at a peripheral region of the second surface of the battery cell so as to be located outside the second circuit board along a direction in which the second surface extends.

2. The battery pack of claim 1, wherein the first and second sides of the first circuit board are at opposite sides along an edge of the first circuit board.

3. The battery pack of claim 1, further comprising a first compressible conductor located between the first electrode and the first circuit board to mediate an electrical connection therebetween.

4. The battery pack of claim 3, wherein the first compressible conductor comprises a contact elastic body or an anisotropic conductive adhesive.

5. The battery pack of claim 1, further comprising an insulating support located between the battery cell and the first circuit board,
wherein the insulating support guides a position of the battery cell and the first circuit board assembled at opposite positions through a side wall and a protrusion portion arranged at opposite positions from a bottom plate with an opening formed to expose at least a portion of the first circuit board.

6. The battery pack of claim 5, further comprising a first compressible conductor arranged in the opening to mediate an electrical connection between the first electrode of the battery cell and the first circuit board.

7. A battery pack comprising:
a battery cell comprising first and second surfaces arranged at opposite sides and at which first and second electrodes are respectively located, and a side surface connecting the first and second surfaces to each other;
a first circuit board arranged on the first surface and connected to the first electrode;
a second circuit board arranged on the second surface;
a first flexible line extending from a first side of the first circuit board to the second circuit board while surrounding a portion of the side surface of the battery cell;
a second flexible line extending from a second side of the first circuit board to the second surface of the battery cell while surrounding another portion of the side surface of the battery cell and connected to the second electrode; and
an insulating support located between the battery cell and the first circuit board,
wherein
the insulating support guides a position of the battery cell and the first circuit board assembled at opposite positions through a side wall and a protrusion portion arranged at opposite positions from a bottom plate with an opening formed to expose at least a portion of the first circuit board,
the insulating support and the first circuit board are aligned with each other as a plurality of alignment pins formed along an edge portion of the insulating support and a plurality of alignment recesses formed along an edge portion of the first circuit board are respectively fitted to each other, and
the insulating support and the first circuit board are coupled to each other as a plurality of coupling portions formed along the edge portion of the insulating support and a plurality of coupling recesses formed along the edge portion of the first circuit board are respectively fitted to each other.

8. The battery pack of claim 1, wherein the second flexible line comprises:
a first end portion connected to the first circuit board; and
a second end portion connected to the second electrode while defining an extended end portion extended away from the first end portion.

9. The battery pack of claim 8, further comprising a second compressible conductor located between the second end portion of the second flexible line and the second electrode to mediate an electrical connection therebetween.

10. The battery pack of claim 9, wherein the second compressible conductor comprises an anisotropic conductive adhesive.

11. The battery pack of claim 8, wherein the second end portion of the second flexible line and the second circuit board are arranged at different positions on the second surface of the battery cell so as not to overlap each other.

12. The battery pack of claim 8, wherein the second circuit board comprises a first side to which the first flexible line is connected and a second side that is opposite to the first side along an edge of the second circuit board, and
a cut portion to avoid an interference with the second end portion of the second flexible line is formed at the second side of the second circuit board.

13. The battery pack of claim 1, wherein the second circuit board has a circular plate shape in which a second-side portion is cut flat.

14. The battery pack of claim 1, wherein the first and second circuit boards define a lowermost portion and an uppermost portion of the battery pack, respectively, and are structurally bound through the first and second flexible lines extending across the side surface of the battery cell on the first and second sides of the first circuit board and first and second sides of the second circuit board.

15. The battery pack of claim 1, wherein the first and second circuit boards are arranged in a horizontal posture parallel to the first and second surfaces on the first and second surfaces of the battery cell.

16. The battery pack of claim 1, wherein
the first and second surfaces of the battery cell have a circular shape, and
the side surface of the battery cell has a rounded circumferential surface to connect the circular first and second surfaces to each other.

17. The battery pack of claim 1, further comprising an insulating support located between the battery cell and the first circuit board,
wherein the insulating support, the first circuit board, and the second circuit board comprise a rounded circumferential surface to correspond to the battery cell.

18. The battery pack of claim 1, wherein the battery cell has a cylindrical shape having a height smaller than a diameter of the first and second surfaces.

19. The battery pack of claim 18, wherein an aspect ratio between the height of the battery cell and the diameter of the first surface is in a range from about 5.4:12 to about 5.4:14.

20. The battery pack of claim 1, wherein the first and second circuit boards comprise a battery management system to control a charge/discharge operation of the battery cell.

* * * * *